United States Patent [19]
Hansen et al.

[11] Patent Number: 6,064,193
[45] Date of Patent: May 16, 2000

[54] METHOD AND APPARATUS FOR MEASURING THE MEAN SQUARE VALUE OF AN ELECTRICAL SIGNAL

[75] Inventors: Victor L. Hansen, Beaverton; Charles L. Saxe, Portland, both of Oreg.

[73] Assignee: Tektronix, Inc., Wilsonville, Oreg.

[21] Appl. No.: 08/896,319

[22] Filed: Jul. 17, 1997

[51] Int. Cl.[7] .................................................. G01R 15/00
[52] U.S. Cl. .......................... 324/132; 324/119; 327/348
[58] Field of Search ............................. 324/132; 327/347, 327/348, 349; 702/198; 364/851, 857, 718, 722

[56] References Cited

U.S. PATENT DOCUMENTS

| | | | |
|---|---|---|---|
| 3,423,578 | 1/1969 | Platzer | 327/348 |
| 4,001,697 | 1/1977 | Withers | 327/348 |
| 4,389,708 | 6/1983 | Baldock | 327/348 |
| 4,959,608 | 9/1990 | Dillman | 324/119 |

OTHER PUBLICATIONS

"An Economical Class of Digital Filters for Decimation and Interpolation" Eugene B. Hogenauer, IEEE Transactions on Acoustics, Speech, and Signal Processing, vol. ASSP–29, No. 2, Apr. 1981, pp. 155–162.

*Primary Examiner*—Maura Regan
*Attorney, Agent, or Firm*—Garth E. Janke; Thomas F. Lenihan

[57] ABSTRACT

A method and apparatus for measuring the RMS value of an electrical signal. An electrical signal is converted to a digital signal. The digital signal is squared and low pass filtered to extract the DC component, the DC component being recognized as the mean-square of the signal. In use in a measurement device, the square root of the DC component is taken and displayed as the RMS value of the electrical signal.

17 Claims, 1 Drawing Sheet

METHOD AND APPARATUS FOR MEASURING THE MEAN SQUARE VALUE OF AN ELECTRICAL SIGNAL

BACKGROUND OF THE INVENTION

This invention relates to electrical measuring devices, particularly devices such as digital multi-meters, adapted for determining the root-mean-square value of an electrical signal.

The root-mean-square ("RMS") value of an electrical signal is the effective value of the signal, or the DC equivalent of the signal that would dissipate the same power in a resistance as would the electrical signal. The average power dissipation in a resistor is proportional to the average of the squares of the amplitude of the signal at successive times (the "mean-square"). The effective or RMS value of the signal, then, is proportional to the square root of the mean-square. The present invention focuses on the mean-square portion of an RMS measurement which, in conjunction with taking the square root of the mean-square measurement, provides for the desired RMS value.

According to and in light of the mathematical definition of the RMS value of a signal, determining the RMS value has heretofore typically been accomplished by implementing the aforementioned mathematical operations, either in software or in hardware. That is, an electrical signal is sampled, the samples are individually squared, the squared samples are summed, the summed, squared samples are averaged and the square root is taken of the result.

In typical analog implementations of an RMS measuring circuit, analog multipliers, integrators and gain stages are employed to square the analog signal and average the results. Specialized devices whose gain characteristics approximate the square root function are then used to take the square root. These implementations are typically expensive and prone to error, as the physical implementations of the mathematical operations are difficult to realize.

Accordingly, it has become preferred to employ a digital implementation of an RMS measuring circuit. A typical digital implementation employs an analog-to-digital converter ("ADC") which produces a series of samples of the electrical signal ("an acquisition"), the series corresponding to a predetermined length of the electrical signal in time, the samples being provided to a processor for mathematically operating on the samples, again by squaring the samples, summing the squares of the samples, and taking the square root of the result. The process is repeated for a subsequent acquisition of the signal.

A source of error in the measurement of RMS results from measuring the mean-square by sampling the signal over a time period that, in general, is not equal to an integral number of quarter wave-lengths of the sinsusoidal ("Fourier") components of the signal. For a Fourier component, the average of the square of any quarter wave-length of the component is equal to the average of the square of the entire component. This will be some DC value "A". However, an arbitrary measured DC value for the component will be larger than "A" by the amount of signal energy contained in any fraction of a quarter wave-length of the original signal that is represented in the acquisition. This phase mis-match between the period of the Fourier components of an unknown signal and the period of the acquisition cannot, especially for signals having a large number of Fourier components, generally be accounted in the selection of the acquisition period, so that the error will generally fall somewhere between zero and the energy contained in a quarter wave-length of the signal. The phase mis-match error can be reduced, in general, only by increasing the acquisition interval and thereby dividing the error by an ever increasing number of samples in the process of averaging. The larger number of acquisitions causes a proportionate decrease in the output rate of the averaging process. Moreover, the processing time and hardware requirements, particularly memory requirements, are also increased.

The phase mis-match error will also, in general, vary from one acquisition to the next. Moreover, since the acquisitions are taken in discrete blocks or "chunks," the difference between the measured mean-square value for one acquisition and the measured mean-square value for another acquisition of a time varying signal may be significant. Therefore, the lack of overlap of the acquisitions assures that there will be, in general, "chunking" error manifest as "digit bobble." But providing for overlap in the acquisitions according to the prior art determination of the mean square to reduce digit bobble also increases the processing time and hardware requirements, particularly memory requirements.

Stated more broadly, the prior art method of measuring mean-square has comprised methods and apparatus for averaging a number of data points, wherein averaging is performed according to the text-book definition of the mean, i.e., adding the data points and dividing by the total number of data points. The only way to decrease the error in such averaging is to take more samples, inherently decreasing the rate of producing results. It would be desirable to employ a method and apparatus that is capable of decreasing error in a mean-square measurement that does not require the taking of more samples and, therefore, does not require a large number of devices to realize in hardware.

Accordingly, there is a need for a method and apparatus for measuring the mean-square value of an electrical signal that provides for improvement in minimizing error and reducing hardware cost, particularly the cost of large numbers of devices in an integrated circuit.

SUMMARY OF THE INVENTION

The method and apparatus for measuring the mean-square value of an electrical signal of the present invention solves the aforementioned problems and meets the aforementioned needs by producing a digital signal representative of the electrical signal, squaring the digital signal to produce a squared representation of the digital signal and digitally processing the squared digital signal to achieve error reduction without the need for an increased number of memory registers.

The invention is based on a number of insights. In the prior art, it has been the goal in measuring RMS to replicate the mathematics corresponding to the standard definitional formula, i.e., reduce the signal to a set of numbers corresponding to samples of the signal, square the individual samples, sum the squared values and divide the sum of the squared values by the number of samples. Therefore, the error can be seen to be reduced only by increasing the number of samples, as aforementioned.

However, if the individual squared samples of the signal are viewed alternatively to retain their identity as a signal, the mean-square may be seen as the mean of a signal which is the square of the input signal. Then, it may be appreciated that digital signal processing techniques may be employed to process that signal. In particular, it may now be appreciated that the squared representation generally has a DC component and a sum of sinusoidally varying components according to the Fourier theorem. So, it can be further appreciated that the mean of the squared representation of the signal, i.e., the desired mean-square, is simply the DC component of the squared representation. Still further, it can now be recognized that low-pass filtering may be employed to select the DC component and reject the sinusoidally varying terms. Yet further, it may be understood that a low-pass filter can be constructed to have arbitrarily good performance characteristics, so that rejection of the high frequency components of the squared representation is as complete as is desired and the error may be minimized to the extent desired. The error can be selectably controlled by the structure and manner of processing, e.g., providing a low-pass filter having a sharper roll-off in the stop-band. This result may be obtained without increasing the number of samples and thereby without increasing memory requirements.

More specifically, the aforedescribed processing includes a step of digital filtering with a Cascaded Integrator Comb ("CIC") decimator filter. This filter employs N cascaded integrator stages, where N preferably equals 3, the output of which is decimated by the factor R and provided to N cascaded comb filters. The overall transfer function of the CIC decimator filter is equivalent to the transfer function of an FIR filter with unity coefficients, except that the length of the FIR filter ("the filter chain"), and therefore the number of delays required to implement the filter, is reduced. The CIC decimator filter is a particularly economical filter which achieves the results of the prior art with, among other things, decreased memory cost.

Many other filters, including IIR filters, also provide for the capability to reduce error for the same hardware, software or throughput costs, or to accomplish the same performance with reduced hardware and software costs or with increased speed as is available with the prior art methods and apparatus. In particular, viewing the mean-square in the frequency domain and the error therein as resulting from the lack of attenuation of high frequency components enables one of ordinary skill in the art to employ a wealth of digital signal processing knowledge in the selection of a filter that optimally reduces error in the mean-square in a particular performance context.

The present invention provides a novel and improved method and apparatus for measuring the mean square value of an electrical signal. Some advantages of the use of this method and apparatus over the prior art are greater reduction of measurement error and lower cost. Advantageously, this system applies digital signal processing techniques to the measurement of the mean square. It should be noted that the digital filter employed has a structure which provides for decreased error at the same cost, or equivalent error for lesser cost. One embodiment of the invention provivdes for selectable performance characteristics. It is particularly noteworthy that the subject method and apparatus is suitable for use in a hand-held digital DMM. The foregoing and other aspects, features and advantages of the present invention will be more readily understood upon consideration of the following detailed description of the invention, taken in conjunction with the following drawings.

DETAILED DESCRIPTION OF A PREFERRED EMBODIMENT

Figure 1:
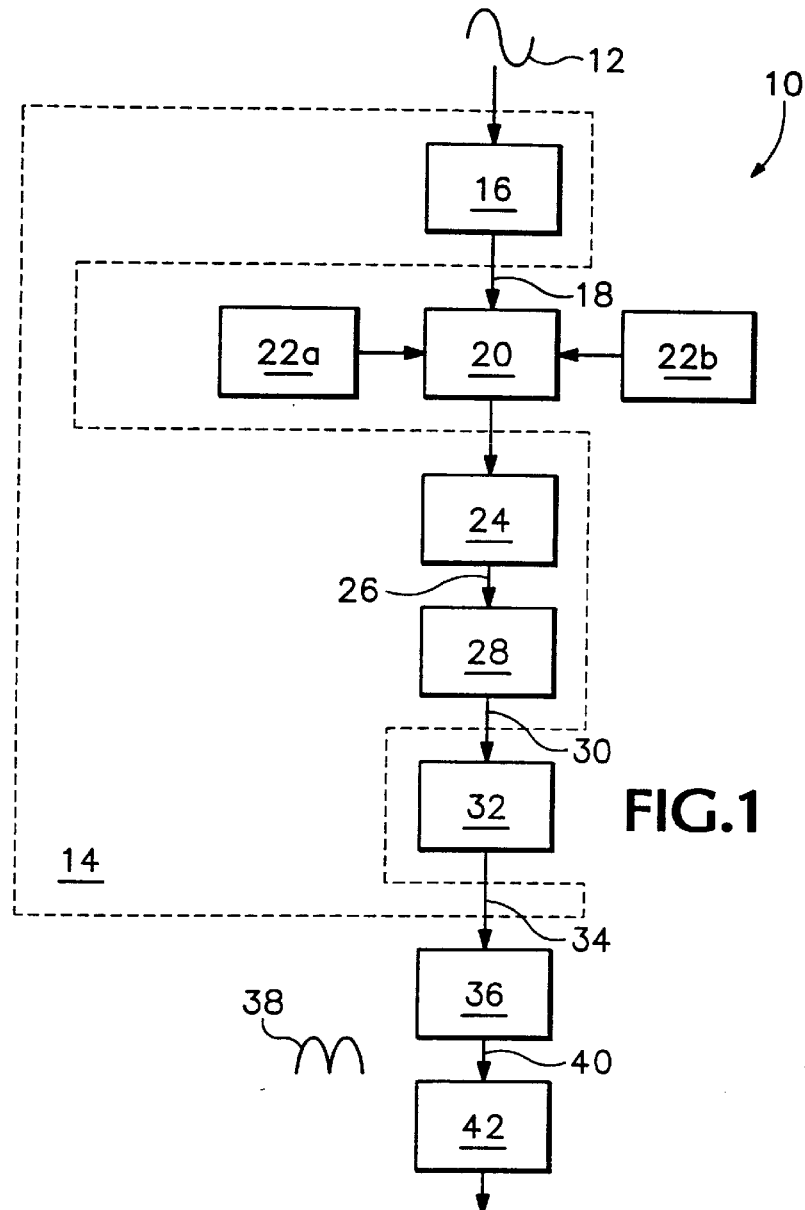
FIG. 1 is a block diagram of an apparatus for measuring the mean-square value of an electrical signal according to the present invention.

Referring to FIG. 1, a preferred embodiment of an apparatus 10 for measuring the mean-square value of an electrical signal 12 according to the present invention is preferably employed in a hand-held DMM; however, the apparatus 10 may be advantageously employed in any measuring instrument which provides for an RMS measurement, such as an oscilloscope. In the RMS measurement, the square root is taken of a measurement of the mean-square value of the electrical signal 12. One embodiment of the present invention focuses on the measurement of the mean-square, while in another embodiment, the square root may be taken and the result is displayed.

The apparatus 10 employs a standard analog-to-digital converter ("ADC") 14 for acquiring samples of the electrical signal 12 and for providing a digital signal representative thereof A preferred ADC 14 for use in a hand-held DMM employs a second order Sigma Delta Converter 16 ("SDC") for producing a 1-bit output 18 at a relatively high sampling rate. Illustratively, in a particular embodiment of the invention for use with a DMM, the output 18 has a rate of 2.5 MHz for sampling signals varying between about 20 Hz and about 20 KHz. The SDC 16 includes noise shaping that concentrates noise into the higher frequencies.

The single bit output 18 of the SDC is obtained from the ADC 14 for driving a multiplexer 20 which multiplexes one or the other of two registers 22a, 22b for provision, at an output 21 of the multiplexer, to a Cascaded Integrator Comb ("CIC") decimation filter portion 24 of the ADC 14. The decimation rate of the filter 24 is adjustable.

A predetermined input gain value is placed into one of the registers 22a, and a negative of the same input gain value placed into register 22a is placed into the other register 22b. By operation of the multiplexer 20, if the output 18 is high, the gain value of register 22a is provided to the filter 24 while, if the output 18 is low, the opposite gain value in register 22b is provided to the filter. Appropriately adjusting the decimation rate of the filter 24, and providing a predetermined value from one of the registers 22a, 22b, in response to the one-bit output of the SDC 16 permits positioning the output 21 in a range of the most significant bits thereof. This may be desirable in order to employ a particular window of bits for purposes of the present invention while the other bits are employed for other purposes. As a particular example, in a 48 bit output of the filter 24, it may be desired to employ only the bottom 16 of the top 24 bits for determining the mean-square.

The CIC decimation filter 24 has an adjustable decimation rate. The decimation rate, along with the size of the input gain value, is pre-adjusted so that a desired word size is produced at an output 26 of the filter, illustratively at a rate of about 100 khz.

The output 26 of the CIC filter 24 is taken from the ADC 14 and provided to a rounder 28. The rounder is adapted to round the least significant bits of the multi-bit output 26, in cooperation with the aforedescribed bit justification by the multiplexer 20.

A rounded output 30 is then provided to a Finite Impulse Response ("FIR") filter 32 portion of the ADC 14, to correct for "droop" in the frequency response of the CIC filter 24 in the pass-band thereof, as is known in the art. An output 34 of the FIR filter provides the final output of the ADC 14.

The aforedescribed ADC 14 is a preferred analog-to-digital conversion apparatus for use with the present invention. However, other analog-to-digital conversion apparatus known in the art may be employed for use in the apparatus 10 without departing from the principles of the invention. Moreover, the multiplexer 20 and the rounder 28 may be employed with other analog-to-digital conversion apparatus than the ADC 14 as aforedescribed.

Figure 2:
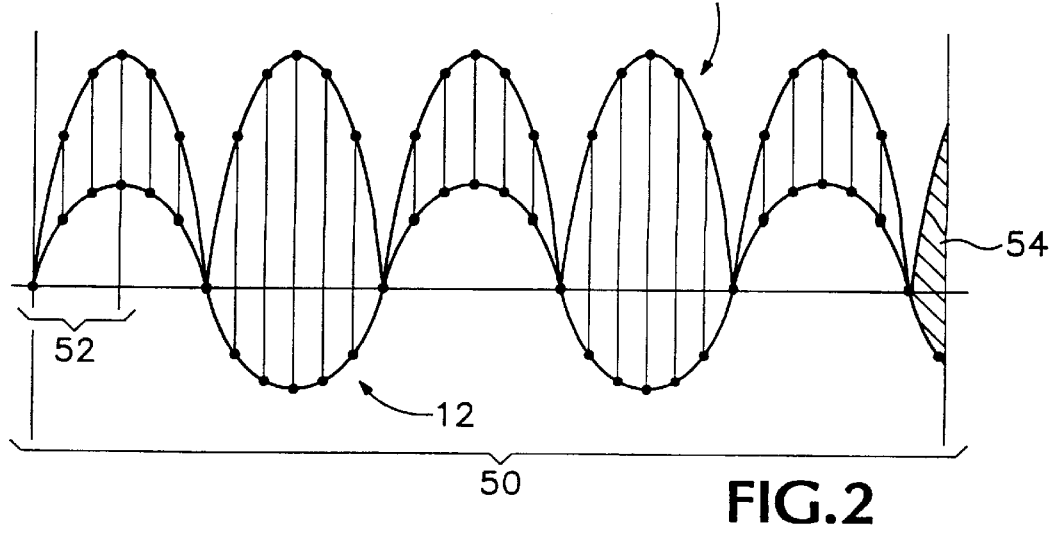
FIG. 2 is a graphical representation of a squared digital signal taken over an interval that does not coincide with an integral number of quarter wave-lengths of the digital signal.

The output 34 of the ADC 14 is provided to a squarer 36, preferably constructed in hardware as in a digital signal processing chip ("DSP"). With reference to FIGS. 1 and 2, the squarer 36 consecutively squares contiguous samples of the output 34 to produce a stream of squared samples to form a squared representation 38 of the signal 12 at an output 40. Like the ADC 14, the squarer 36 may be any squaring apparatus known in the art.

In the prior art, the electrical signal is sampled, the samples are individually squared, the squared samples are summed, the summed, squared samples are averaged and the square root is taken of the result. Averaging results in error as has been described. An example of the aforedescribed error in prior art averaging is shown in FIG. 2, wherein an acquistition interval 50 for prior art averaging does not coincide with an integral number of quarter wavelengths 52 of the original input signal 12, resulting in excess energy 54 in a measurement of the DC value of the squared representation 38. The energy 54 is excess to the extent that the signal is not periodic over the acquisition interval 50.

As aforementioned, to reduce the error in the mean-square, i.e., the excess energy 54, generally requires increasing the number of samples. This has the effect of requiring a greater number of storage registers to store the samples and a longer time over which the samples are collected. In the present invention, however, the problem is viewed in the frequency domain. Particularly, it is recognized that the mean-square value of a first signal is precisely the mean of a second signal that is the square of the first signal. Therefore, to measure the mean-square of the electrical signal 12, it is only necessary to filter its squared digital representation 38. Particularly, it has been found that low-pass filtering provides the desired mean-square value.

To illustrate, in a signal having no DC component, such as an AC coupled signal, the square of the signal is simply the square of a sum of sinusoidal terms. This square has a DC term, a series of sinusoidal squared terms having twice the frequency of corresponding original sinusoidal terms, a series of sinusoidal cross-product terms having frequencies equal to the sum of the frequencies of corresponding pairs of different, original sinusoidal terms, ("sum frequency terms"), and a series of sinusoidal cross-product terms having frequencies equal to the difference between the frequencies of corresponding pairs of different, original sinusoidal terms ("difference frequency terms"). Only the DC term, however, survives averaging, because any sinusoidal term averages to zero. Thence, the mean of the square of the signal must be equal to the DC component, since the mean of all the sinusoidal components is zero.

In general, the squared representation 38, like any physical signal, may be represented by a Fourier series which comprises a DC component and a sum of sinusoidal components. Thence, the mean or average of the squared representation 38 must always be equal to the DC component.

In light of the above, a low pass filter 42 passes the DC component of the squared representation 38 and rejects, by attenuation, all of the sinusoidal components. Thence, the low-pass filter 42 provides for the mean-square to a desired degree of accuracy which depends on the roll-off rate of the filter. As will now be readily appreciated by those having ordinary skill in the art, many digital filters, both finite-impulse response ("FIR") and infinite-impulse response ("IIR"), may be constructed to provide more powerful performance in the context of a mean-square measurement than has been available in the prior art measurements of mean-square.

However, not every digital filter has performance characteristics that provide the advantages over prior art averaging of the present invention. For example, an averaging FIR filter may be adapted to have improved stop-band rejection by adding additional delays or taps. However, this approach suffers from the same drawbacks as does prior art averaging, i.e., greater silicon is required and a larger sample must be taken to reduce the error. A CIC decimator filter, on the other hand, provides for a more economical realization of the aforementioned FIR filter. See E. Hogenauer, "An Economical Class of Digital Filters for Decimation and Interpolation," 155–162 IEEE TRANSACTIONS ON ACOUSTICS, SPEECH, AND SIGNAL PROCESSING, Vol. ASSP-29, No. 2, April 1981 (herein incorporated by reference in its entirety). This filter, preferred in the context of a mean-square measurement in a hand-held DMM, requires no multipliers and comprises cascaded integrator stages operating at a high sampling rate and an equal number of comb stages operating at a low sampling rate. The aforedescribed CIC filter 24 preferably employs this structure. The transfer function for the filter is:

$$H(z) = \frac{[1 - z^{-R}]^N}{[1 - z^{-1}]^N}$$

where, R=rate decrease between the integrator section and the comb section of the filter due to decimation;

N=number of integrator stages and number of comb stages (the aforementioned "order" of the filter).

$$= \sum_{R=0}^{RM-1} [z^{-K}]^N$$

It can be seen that the transfer function reduces to that of a cascade of N uniform FIR filter stages. However, because of decimation at the rate R, it can also be seen that the CIC decimation filter functions as an equivalent unity gain FIR filter having RM additional taps or delays. Thence, the CIC decimation filter provides for the performance of an averaging FIR filter having a longer filter chain without actually physically implementing the additional elements of the chain. Therefore, the preferred filter realizes a savings in hardware while achieving the same performance as the averaging FIR filter, thereby achieving better performance than is available in the prior art.

An IIR filter may also provide for increased performance for a given amount of silicon. As aforementioned, the phase mis-match error cannot, in general, be relieved by a priori selection of the acquisition interval. Therefore, when filtering the squared representation 38, it is of little or no concern to preserve phase relationships among the various Fourier components. It is known that IIR filters generally provide for increased frequency rejection in the stop-band while sacrificing phase-frequency fidelity. Thence, in a measurement of mean-square, an IIR filter naturally provides a highly desirable trade-off. The IIR filter, in distinction to the FIR filter, has a transfer function that includes one or more poles.

In general, treating the squared representation 38 as a signal rather than a set of numbers provides the opportunity to apply well known digital signal processing techniques for measuring the mean-square, by optimizing a digital filter to process the squared representation 38 and, thereby, selectably control the error in the measurement.

Notwithstanding, it is in general difficult to pass a DC component and yet reject sinusoidal components of the squared representation 38 which have very low frequency. Such frequency components—the aforedescribed difference frequency components—arise from beating between any Fourier components of the signal 12 that are very close in frequency and amount to a low frequency modulation of the DC component.

However, in practice, it is often desired to determine the RMS over only a limited time interval, so that the DC component as modulated by sufficiently low frequency components is, typically, the measurement of practical interest. Therefore, it may not be necessary or desirable to construct the filter 42 to remove modulating components that have very low frequencies. A further advantage of the present invention, then, is that error that is not objectionable may be selectably permitted to remain, by straight-forward design of the transfer function of the low pass filter 42.

However, the cutoff frequency of the low pass filter 42 is selected so that the sinusoidal squared terms corresponding to frequency components in the range of measurement interest are filtered out. Thence, the cutoff frequency should be less than twice the lowest frequency of this range, since the sinusoidal squared term corresponding to the lowest frequency component in the range has a frequency that is twice the lowest frequency.

The mean-square value is typically employed in a determination of the RMS as aforementioned. In a preferred embodiment of the invention, a micro-processor 60 reads the filtered, squared representation 38 from a memory 62 and computes, in software, the square root thereof. The processor 60 then writes the resulting RMS value to a user display 64, such as a 5 digit, seven-segment LCD display in the DMM.

It is to be emphasized that, while a specific method and apparatus for measuring the RMS value of an electrical signal has been shown as preferred, other configurations could be utilized, in addition to configurations already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. A circuit for determining the mean-square value of a signal, comprising:
   a sampling circuit for receiving said electrical signal and producing digitized samples thereof;
   a squaring circuit, responsive to said sampling circuit, for producing a signal representative of squared ones of said digitized samples; and
   a digital lowpass filter, coupled to said squaring circuit, for receiving and filtering said squared signal, said digital filter comprising a predetermined number of delay elements.

2. The circuit of claim 1, wherein said digital lowpass filter operates over a predetermined range of frequencies and exhibits a cutoff frequency having a value less than substantially twice the lowest frequency of said range.

3. The circuit of claim 1, wherein said digital filter has a transfer function which includes one or more poles.

4. The circuit of claim 1, wherein said digital filter includes one or more cascaded integrator portions, a corresponding one or more comb portions, and a decimator portion therebetween.

5. The circuit of claim 4, whrein the number of said cascaded integrator portions and said comb portions is three.

6. The circuit of claim 4, wherein a parameter selected to reduce the number of delay elements is the decimation rate.

7. The circuit of claim 3, wherein a parameter selected to reduce the number of delay elements is the number of said poles.

8. The circuit of claim 1, wherein said digital lowpass filter includes parameters selected so as to reduce the number of delay elements needed to achieve a predetermined maximum error.

9. A method for determining the mean-square value of a signal, comprising the steps of:
   receiving said electrical signal;
   producing digitized samples thereof;
   producing a squared signal comprising squared representations of the digitized said samples;
   providing a digital lowpass filter having a predetermined number of delay elements; and
   filtering said squared signal with said digital lowpass filter.

10. The method of claim 9, wherein said step of filtering includes operating said digital lowpass filter over a predetermined range of frequencies, and wherein said step of providing provides said digital lowpass filter with a cutoff frequency having a value less than substantially twice the lowest frequency of said range.

11. The method of claim 9, wherein said step of providing provides said digital lowpass filter with a transfer function which includes one or more poles.

12. The method of claim 9, wherein said step of providing provides said digital lowpass filter with one or more cascaded integrator portions, a corresponding one or more comb portions, and a decimator portion therebetween.

13. The method of claim 12, further comprising a step of providing said digital lowpass filter with three cascaded integrator portions and three comb portions.

14. The method of claim 13, wherein said step of providing comprises selecting the decimation rate of said lowpass digital filter to reduce the number of delay elements.

15. The method of claim 9 wherein said step of providing provides said digital lowpass filter with a transfer function which includes one or more poles, wherein a parameter selected to reduce the number of delay elements is the number of said poles.

16. The method of claim 9, wherein said step of providing includes providing said digital lowpass filter with selectable performance parameters; the method further including the step of selecting said parameters so as to reduce the number of delay elements needed to achieve a predetermined maximum measurement error.

17. A device for measuring the RMS value of an input signal, said device comprising:

a sampling circuit for receiving said input signal and producing digized samples thereof;

a squaring circuit, responsive to said sampling circuit, for producing a signal representative of squared ones of said digitized samples;

a digital lowpass filter, coupled to said squaring circuit, for receiving and filtering said squared signal and developing a DC component signal at an output, said digital filter comprising a predetermined number of delay elements;

circuitry for extracting the square root of said DC component signal; and display circuitry for displaying a value representative of said square root of said DC component signal.

* * * * *